(12) United States Patent
Sasajima

(10) Patent No.: US 7,944,226 B2
(45) Date of Patent: May 17, 2011

(54) TEST APPARATUS AND TRANSMISSION APPARATUS

(75) Inventor: Kei Sasajima, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/685,524

(22) Filed: Jan. 11, 2010

(65) Prior Publication Data

US 2010/0176835 A1 Jul. 15, 2010

Related U.S. Application Data

(63) Continuation of application No. PCT/JP2008/062354, filed on Jul. 8, 2008.

(30) Foreign Application Priority Data

Jul. 13, 2007 (JP) ................................. 2007-184132

(51) Int. Cl.
*G01R 31/00* (2006.01)
*G01R 31/26* (2006.01)
(52) U.S. Cl. ......... 324/756.01; 324/756.06; 324/762.01; 324/73.1
(58) Field of Classification Search .................... None
See application file for complete search history.

(56) References Cited

U.S. PATENT DOCUMENTS

| | | | |
|---|---|---|---|
| 6,133,725 A | 10/2000 | Bowhers | |
| 6,275,023 B1 * | 8/2001 | Oosaki et al. | 324/756.06 |
| 6,956,393 B1 * | 10/2005 | Tanaka | 324/750.3 |
| 7,373,574 B2 | 5/2008 | Kojima | |
| 2006/0010360 A1 | 1/2006 | Kojima | |

FOREIGN PATENT DOCUMENTS

| | | |
|---|---|---|
| JP | 2002-507754 A | 3/2002 |
| JP | 2006-23233 A | 1/2006 |

OTHER PUBLICATIONS

International Search Report (ISR) issued in PCT/JP2008/062354 (parent application) for Examiner consideration, citing U.S. Patents Nos. 1-2, and Foreign Patent Document Nos. 1-2 listed above.
Written Opinion (PCT/ISA/237) issued in PCT/JP2008/062354 (parent application).

* cited by examiner

*Primary Examiner* — Minh N Tang
(74) *Attorney, Agent, or Firm* — Chen Yoshimura LLP

(57) ABSTRACT

A test apparatus for testing a device under test includes a test signal generating section that generates a test signal to be supplied to the device under test, a main driving section that outputs an output voltage determined in accordance with the test signal, to an input/output pin connected to a signal input/output terminal of the device under test, a replica driving section that outputs a comparison voltage determined in accordance with the test signal, a resistance voltage dividing section that generates a divided voltage by resistance-dividing the comparison voltage, a comparing section that compares a voltage of the input/output pin with the divided voltage, a judging section that judges acceptability of the device under test based on a result of the comparison by the comparing section, and an adjusting section that adjusts a voltage dividing ratio of the resistance voltage dividing section so that the divided voltage becomes equal to a voltage obtained by adding together a predetermined threshold voltage and a voltage of the input/output pin that is observed when the main driving section has output the output voltage and the signal input/output terminal of the device under test has not output a response signal.

13 Claims, 8 Drawing Sheets

TEST APPARATUS AND TRANSMISSION APPARATUS

BACKGROUND

1. Technical Field

The present invention relates to a test apparatus for testing a device under test and a transmission apparatus.

2. Related Art

A test apparatus for testing a device under test (DUT) such as a semiconductor is known. The test apparatus uses a driver to generate a test signal and supply the generated test signal to the DUT. The test apparatus also receives a response signal output from the DUT in response to the supplied test signal and uses a comparator to detect the logic value of the received response signal. Based on the result of the detection, the test apparatus judges whether the DUT is acceptable. Here, a known test apparatus uses a single transmission line to transmit a test signal to one of the terminals of the DUT and to receive a response signal output from the one terminal (i.e., a single transmission connection test apparatus).

Referring to such a test apparatus, it is desired to generate the test signals at a shorter interval in order to reduce the overall test time. When the test apparatus generates the test signals at an interval shorter than the sum of double the transmission time through the transmission line and the response time of the DUT, however, the reception by the comparator of the response signal output from the DUT substantially concurrently occurs with the output of the next test signal from the driver. Which is to say, when the single transmission connection test apparatus is configured to generate the test signals at a too short interval, the response signal to be received by the comparator is superimposed by the next test signal output from the driver. As a result, the test apparatus cannot accurately detect the level of the response signal.

Patent Document 1 discloses a single transmission connection test apparatus that is capable of solving the above-described drawback. According to the disclosure of Patent Document 1, the test apparatus includes a driver that generates a voltage in accordance with a test signal, a replica driver that generates a voltage equal to the sum of the output voltage of the driver and a threshold voltage used for determining a logic level, a voltage divider circuit that resistance divides the output voltage of the replica driver based on the output resistance ratio between the driver and a DUT, and a comparator that detects the logic level of a response signal. According to the test apparatus, the comparator compares the response signal from the DUT with the divided voltage obtained as a result of the division by the voltage divider circuit, to detect the logic level of the response signal. With such a configuration, even when the reception of the response signal concurrently occurs with the output of the next test signal, the test apparatus disclosed in Patent Document 1 can accurately compare the response signal from the DUT with the threshold voltage by canceling the output voltage of the driver.

Patent Document 1: Japanese Patent Application Publication No. 2006-23233

Here, each DUT has a significantly different output resistance from other DUTs. In one example, each DUT is different by approximately 20% in terms of its output resistance than other DUTs. This makes it difficult for the test apparatus disclosed in Patent Document 1 to control the output resistance ratio between the driver and the DUT to be equal to the voltage dividing ratio of the voltage divider circuit. For this reason, the test apparatus disclosed in Patent Document 1 has difficulties in accurately canceling the output voltage of the driver for each DUT.

Furthermore, DUTs of a particular type may have a significantly different output resistance specification from DUTs of other types. If such is the case, the test apparatus disclosed in Patent Document 1 also cannot accurately cancel the output voltage of the driver for DUTs having a different output resistance specification.

SUMMARY

An advantage of some aspects of the present invention is to provide a test apparatus and a transmission apparatus which are capable of solving the above-stated problems. This advantage is achieved by combining the features recited in the independent claims. The dependent claims define further effective specific example of the present invention.

To solve the above-described problems, a first embodiment of the present invention provides a test apparatus for testing a device under test, including a test signal generating section that generates a test signal to be supplied to the device under test, a main driving section that outputs an output voltage determined in accordance with the test signal, to an input/output pin connected to a signal input/output terminal of the device under test, a replica driving section that outputs a comparison voltage determined in accordance with the test signal, a resistance voltage dividing section that generates a divided voltage by resistance-dividing the comparison voltage, a comparing section that compares a voltage of the input/output pin with the divided voltage, a judging section that judges acceptability of the device under test based on a result of the comparison by the comparing section, and an adjusting section that adjusts a voltage dividing ratio of the resistance voltage dividing section so that the divided voltage becomes equal to a voltage obtained by adding together a predetermined threshold voltage and a voltage of the input/output pin that is observed when the main driving section has output the output voltage and the signal input/output terminal of the device under test has not output a response signal.

A second embodiment of the present invention provides a test apparatus for testing a device under test, including a test signal generating section that generates a test signal to be supplied to the device under test, a main driving section that outputs an output voltage determined in accordance with the test signal, to an input/output pin connected to a signal input/output terminal of the device under test, a replica driving section that outputs a comparison voltage determined in accordance with the test signal, a comparing section that compares a voltage of the input/output pin with a voltage obtained by adding together a predetermined threshold voltage and the comparison voltage, a judging section that judges acceptability of the device under test based on a result of the comparison by the comparing section, and an adjusting section that adjusts the comparison voltage output from the replica driving section so as to be equal to a voltage of the input/output pin that is observed when the main driving section has output the output voltage and the signal input/output terminal of the device under test has not output a response signal.

A third embodiment of the present invention provides a transmission apparatus for transmitting/receiving a signal to/from a different apparatus, including a main driving section that outputs an output voltage determined in accordance with a transmission signal, to an input/output pin connected to a signal input/output terminal of the different apparatus, a replica driving section that outputs a comparison voltage determined in accordance with the transmission signal, a resistance voltage dividing section that generates a divided voltage by resistance-dividing the comparison voltage, a comparing section that compares a voltage of the input/output pin with the divided voltage, and an adjusting section that adjusts a voltage dividing ratio of the resistance voltage dividing section so that the divided voltage becomes equal to a voltage obtained by adding together a predetermined threshold voltage and a voltage of the input/output pin that is observed when the main driving section has output the output voltage and the signal input/output terminal of the different apparatus has not output a reception signal.

A fourth embodiment of the present invention provides a transmission apparatus for transmitting/receiving a signal to/from a different apparatus, including a main driving section that outputs an output voltage determined in accordance with a transmission signal, to an input/output pin connected to a signal input/output terminal of the different apparatus, a replica driving section that outputs a comparison voltage determined in accordance with the transmission signal, a comparing section that compares a voltage of the input/output pin with a voltage obtained by adding together a predetermined threshold voltage and the comparison voltage, and an adjusting section that adjusts the comparison voltage output from the replica driving section so as to be equal to a voltage of the input/output pin that is observed when the main driving section has output the output voltage and the signal input/output terminal of the different apparatus has not output a reception signal.

Here, all the necessary features of the present invention are not listed in the summary. The sub-combinations of the features may become the invention.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
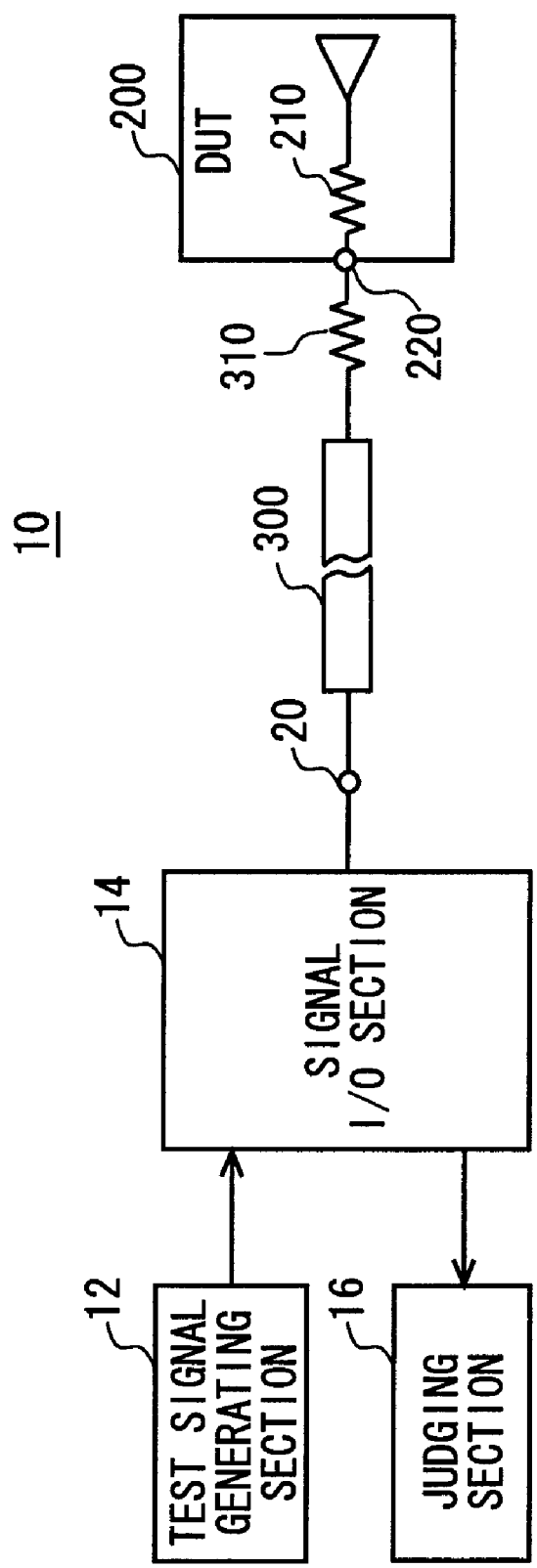
FIG. 1 illustrates the configuration of a test apparatus 10 relating to an embodiment of the present invention, together with a DUT 200.

FIG. 1 illustrates the configuration of a test apparatus 10 relating to an embodiment of the present invention, together with a device under test (DUT) 200. The test apparatus 10 tests the DUT 200. The test apparatus 10 includes a test signal generating section 12, a signal input/output (I/O) section 14, a judging section 16, and a transmission line 300.

The test signal generating section 12 generates a test signal to be supplied to the DUT 200. For example, the test signal generating section 12 may generate a test signal indicating one of the H logic and L logic.

The signal I/O section 14 receives the test signal from the test signal generating section 12, and applies an output voltage determined in accordance with the logic level of the received test signal to the DUT 200. In one example, the signal I/O section 14 applies an output voltage corresponding to the H logic to the DUT 200 when the received test signal indicates the H logic, and applies an output voltage corresponding to the L logic to the DUT 200 when the received test signal indicates the L logic.

The signal I/O section 14 also compares the voltage of a response signal that is output from a signal I/O terminal 220 of the DUT 200 as a result of the application to the DUT 200 of the output voltage determined in accordance with the test signal, with a predetermined threshold voltage. For example, the signal I/O section 14 may compare the voltage of the response signal with a predetermined H-logic threshold voltage ($V_{OH}$) which is used to judge whether the response signal indicates the H logic. Alternatively, the signal I/O section 14 may compare the voltage of the response signal with a predetermined L-logic threshold voltage ($V_{OL}$) which is used to judge whether the response signal indicates the L logic.

The judging section 16 judges whether the DUT 200 is acceptable based on the result of the comparison done by the signal I/O section 14. For example, the judging section 16 may judge the acceptability of the DUT 200 by acquiring the result of the comparison by the signal I/O section 14 at a predetermined strobe timing and comparing the acquired comparison result with an expected value. For example, the judging section 16 may judge that the logic level of the response signal is indeterminate when the acquired comparison result indicates neither the H logic nor the L logic.

The transmission line 300 connects the signal I/O section 14 and the DUT 200 to each other. More specifically, the transmission line 300 connects, to each other, an I/O pin 20 of the signal I/O section 14 and the signal I/O terminal 220 of the DUT 200. In this manner, the transmission line 300 can apply the output voltage determined in accordance with the test signal, which is output from the signal I/O section 14, to the signal I/O terminal 220 of the DUT 200. Furthermore, the transmission line 300 can supply the response signal that is output from the signal I/O terminal 220 of the DUT 200 as a result of the application of the output voltage determined in accordance with the test signal, to the I/O pin 20 of the signal I/O section 14.

Having the above-described configuration, the test apparatus 10 can test the DUT 200 by using the single transmission line 300 in order to transmit the test signal to the signal I/O terminal 220 of the DUT 200 and to receive the response signal from the signal I/O terminal 220. Here, the test apparatus 10 may further include a matching resistance 310, which is provided in series with the transmission line 300.

Figure 2:
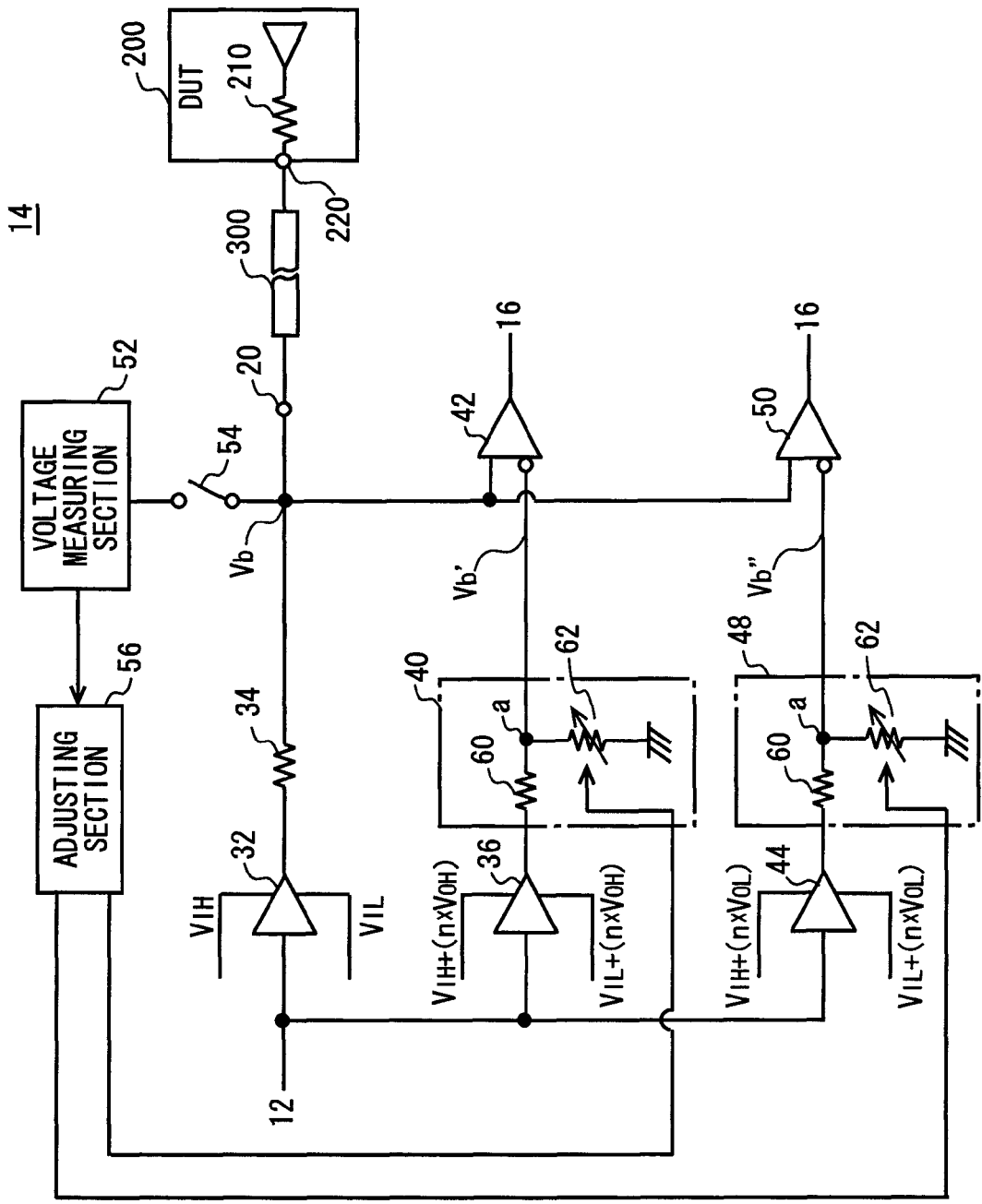
FIG. 2 illustrates the configuration of a signal I/O section 14 relating to the embodiment of the present invention.

FIG. 2 illustrates the configuration of the signal I/O section 14 relating to the embodiment of the present invention, together with the DUT 200 and the transmission line 300. The signal I/O section 14 includes a main driving section 32, an output resistance 34, a first replica driving section 36, a first resistance voltage dividing section 40, a first comparing section 42, a second replica driving section 44, a second resistance voltage dividing section 48, a second comparing section 50, a voltage measuring section 52, a relay 54, and an adjusting section 56.

The main driving section 32 receives the test signal output from the test signal generating section 12 and outputs the output voltage determined in accordance with the test signal to the I/O pin 20 which is connected to the signal I/O terminal 220 of the DUT 200. According to the present embodiment, the main driving section 32 outputs an H-logic output voltage ($V_{IH}$) corresponding to the H logic to the I/O pin 20 when the test signal indicates the H logic, and outputs an L-logic output voltage ($V_{IL}$) corresponding to the L logic to the I/O pin 20 when the test signal indicates the L logic. For example, the main driving section 32 may be a driver circuit.

The output resistance 34 is disposed between the main driving section 32 and the I/O pin 20. The output resistance 34 is provided in order to achieve a match between the resistance value observed when the DUT 200 is seen from the I/O pin 20 and the resistance value observed when the main driving section 32 is seen from the I/O pin 20. For example, the output resistance 34 may have a predetermined resistance value (for example, 50Ω) in compliance with several factors including the specifications of the DUT 200. The output resistance 34 may be disposed within the main driving section 32.

The first replica driving section 36 receives the test signal output from the test signal generating section 12 and outputs a comparison voltage determined in accordance with the received test signal. According to the present embodiment, the first replica driving section 36 outputs a comparison voltage equal to the sum of the output voltage output from the main driving section 32 and the voltage obtained by multiplying the H-logic threshold voltage $V_{OH}$ by a predetermined value n. Specifically speaking, when the test signal indicates the H logic, the first replica driving section 36 outputs a comparison voltage ($V_{IH}+(n \times V_{OH})$) equal to the sum of the H-logic output voltage $V_{IH}$ and the voltage obtained by multiplying the H-logic threshold voltage $V_{OH}$ by the predetermined value n. On the other hand, when the test signal indicates the L logic, the first replica driving section 36 outputs a comparison voltage $V_{IL}+(n \times V_{OH})$ equal to the sum of the L-logic output voltage $V_{IL}$ and the voltage obtained by multiplying the H-logic threshold voltage $V_{OH}$ by the predetermined value n.

For example, the predetermined value n may be defines as an inverse of the ratio of the specification resistance value observed when the DUT 200 is seen from the I/O pin 20 (for example, 50Ω) to the specification resistance value observed when the DUT 200 is seen from the main driving section 32 (for example, 100Ω). When the output resistance 34 has a specification resistance value of 50Ω and the output resistance 210 of the DUT 200 has a specification resistance value of 50Ω, the predetermined value n may be 2{=1/(50Ω/100Ω)}.

For example, the first replica driving section 36 may be a driver circuit that has the same functionality as the main driving section 32. In this manner, the first replica driving section 36 can output a comparison voltage that is accurately synchronized with the output voltage of the main driving section 32.

The first resistance voltage dividing section 40 generates a divided voltage by resistance dividing the comparison voltage output from the first replica driving section 36. The voltage dividing ratio of the first resistance voltage dividing section 40 is adjusted by the adjusting section 56.

For example, the first resistance voltage dividing section 40 may include a first resistance 60 and a second resistance 62. The first resistance 60 is connected between the output end of the first replica driving section 36 and a connection point a, and the second resistance 62 is connected between the connection point a and the ground. The first resistance voltage dividing section 40 generates a divided voltage at the connection point a. Furthermore, the first resistance 60 may have the same resistance value as the output resistance 34. The second resistance 62 may be a variable resistance which is adjustable by the adjusting section 56.

The first comparing section 42 compares the voltage of the I/O pin 20 with the divided voltage output from the first resistance voltage dividing section 40. According to the present embodiment, the first comparing section 42 outputs a comparison result indicating whether or not the response signal output from the DUT 200 indicates the H logic.

The second replica driving section 44 receives the test signal output from the test signal generating section 12 and outputs a comparison voltage determined in accordance with the received test signal. According to the present embodiment, the second replica driving section 44 outputs a comparison voltage equal to the sum of the output voltage output from the main driving section 32 and the voltage obtained by multiplying the L-logic threshold voltage $V_{OL}$ by the predetermined value n. Specifically speaking, when the test signal indicates the H logic, the second replica driving section 44 outputs a comparison voltage ($V_{IH}+(n \times V_{OL})$) equal to the sum of the H-logic output voltage $V_{IH}$ and the voltage obtained by multiplying the L-logic threshold voltage $V_{OL}$ by the predetermined value n. On the other hand, when the test signal indicates the L logic, the second replica driving section 44 outputs a comparison voltage ($V_{IL}+(n \times V_{OL})$) equal to the sum of the L-logic output voltage $V_{IL}$ and the voltage obtained by multiplying the L-logic threshold voltage $V_{OL}$ by the predetermined value n. Here, the predetermined value n may be determined in the same manner as is the case with the first replica driving section 36.

For example, the second replica driving section 44 may be a driver circuit that has the same functionality as the main driving section 32. In this manner, the second replica driving section 44 can output a comparison voltage that is accurately synchronized with the output voltage of the main driving section 32.

The second resistance voltage dividing section 48 generates a divided voltage by resistance dividing the comparison voltage output from the second replica driving section 44. The voltage dividing ratio of the second resistance voltage dividing section 48 is adjusted by the adjusting section 56. For example, the second resistance voltage dividing section 48 may have the same configuration as the first resistance voltage dividing section 40.

The second comparing section 50 compares the voltage of the I/O pin 20 with the divided voltage output from the second resistance voltage dividing section 48. According to the present embodiment, the second comparing section 50 outputs a comparison result indicating whether or not the response signal output from the DUT 200 indicates the L logic.

The voltage measuring section 52 measures the voltage of the I/O pin 20 that is observed when the main driving section 32 has output the output voltage according to the test signal and the signal I/O terminal 220 of the DUT 200 has not output the response signal (the no-response I/O pin voltage Vb). In this manner, the voltage measuring section 52 can measure a voltage obtained by resistance dividing the output voltage output from the main driving section 32 by the resistance value observed when the DUT 200 is seen from the I/O pin 20 and the resistance value observed when the main driving section 32 is seen from the I/O pin 20. Here, the resistance value observed when the DUT 200 is seen from the I/O pin 20 is equal to the resistance value of the output resistance 34. Furthermore, the resistance value observed when the DUT 200 is seen from the I/O pin 20 is equal to the sum of the resistance values of the transmission line 300, the matching resistance 310 and the output resistance 210.

For example, the voltage measuring section 52 may measure the voltage of the I/O pin 20 when the main driving section 32 outputs at least one of the H-logic output voltage $V_{IH}$ and the L-logic output voltage $V_{IL}$. When the resistance value of the output resistance 34 is known, the voltage measuring section 52 may measure the resistance value between the I/O pin 20 and the ground, and obtain the no-response I/O pin voltage Vb based on the measured resistance value.

The relay 54 connects the I/O pin 20 to the measuring end of the voltage measuring section 52 when the voltage measuring section 52 measures the voltage of the I/O pin 20, and keeps the I/O pin 20 disconnected from the measuring end of the voltage measuring section 52 in other cases. The relay 54 can remove the influence of the voltage measuring section 52 on the I/O pin 20 except when the voltage measuring section 52 operates.

The adjusting section 56 adjusts the voltage dividing ratio of the first resistance voltage dividing section 40 and the voltage dividing ratio of the second resistance voltage dividing section 48 based on the result of the measurement by the voltage measuring section 52. More specifically, the adjusting section 56 adjusts the voltage dividing ratios of the first and second resistance voltage dividing sections 40 and 48 so that the divided voltages output from the first and second resistance voltage dividing sections 40 and 48 become equal to the voltage obtained by adding together the predetermined threshold voltage and the voltage of the I/O pin 20 observed when the main driving section 32 has output the output voltage and the signal I/O terminal 220 of the DUT 200 has not output the response signal (the no-response I/O pin voltage Vb).

In other words, the adjusting section 56 adjusts the voltage dividing ratio of the first resistance voltage dividing section 40 so that the divided voltage Vb' output from the first resistance voltage dividing section 40 becomes equal to the voltage obtained by adding together the no-response I/O pin voltage Vb and the H-logic threshold voltage $V_{OH}$. Furthermore, the adjusting section 56 adjusts the voltage dividing ratio of the second resistance voltage dividing section 48 so that the divided voltage Vb" output from the second resistance voltage dividing section 48 becomes equal to the voltage obtained by adding together the no-response I/O pin voltage Vb and the L-logic threshold voltage $V_{OL}$.

For example, the adjusting section 56 may directly detect the divided voltages from the first and second resistance voltage dividing sections 40 and 48, and then adjust the respective voltage dividing ratios so that the divided voltages respectively become equal to the corresponding voltages. Alternatively, the adjusting section 56 may detect one of the divided voltages from the first and second resistance voltage dividing sections 40 and 48, and adjust a corresponding one of the voltage dividing ratios so that the divided voltage becomes equal to the corresponding voltage. In this case, the adjusting section 56 may set the other voltage dividing ratio at the same level. As a further alternative example, the adjusting section 56 may prestore a table in which each value of the no-response I/O pin voltage Vb is written in association with a voltage dividing ratio, and detect in the table a voltage dividing ratio in accordance with the result of the measurement by the voltage measuring section 52.

The test apparatus 10 having the above-described configuration compares the voltage of the I/O pin 20 with the comparison voltage obtained by adding together the output voltage of the main driving section 32 and the threshold voltage. Therefore, the test apparatus 10 can cancel, from the voltage of the I/O pin 20, the voltage determined in accordance with the test signal, and compare the resulting voltage with the threshold voltage even when the reception of the response signal output from the DUT 200, at the I/O pin 20 after the transmission through the transmission line 300 concurrently occurs with the output of the next test signal to be supplied to the DUT 200 and the response signal is thus superimposed with the test signal at the I/O pin 20. As a result, the test apparatus 10 can accurately test the DUT 200 even when configured to generate the test signals at short intervals.

As explained above, the test apparatus 10 adjusts the voltage dividing ratios of the first and second resistance voltage dividing sections 40 and 48. With such a configuration, even when the output resistance 210 of each DUT 200 or each type of DUTs 200 has a different resistance value, the test apparatus 10 can accurately generate the comparison voltage, which is equal to the sum of the output voltage of the main driving section 32 and the threshold voltage. As a result, the test apparatus 10 can accurately cancel the voltage determined in accordance with the test signal from the voltage of the I/O pin 20 and compare the resulting voltage with the threshold voltage, even when the output resistance 210 of each DUT 200 has a different resistance value, when the test apparatus 10 is used to test a different type of DUTs 200, whose output resistance 210 has a different specification resistance value, and the like.

Figure 3:
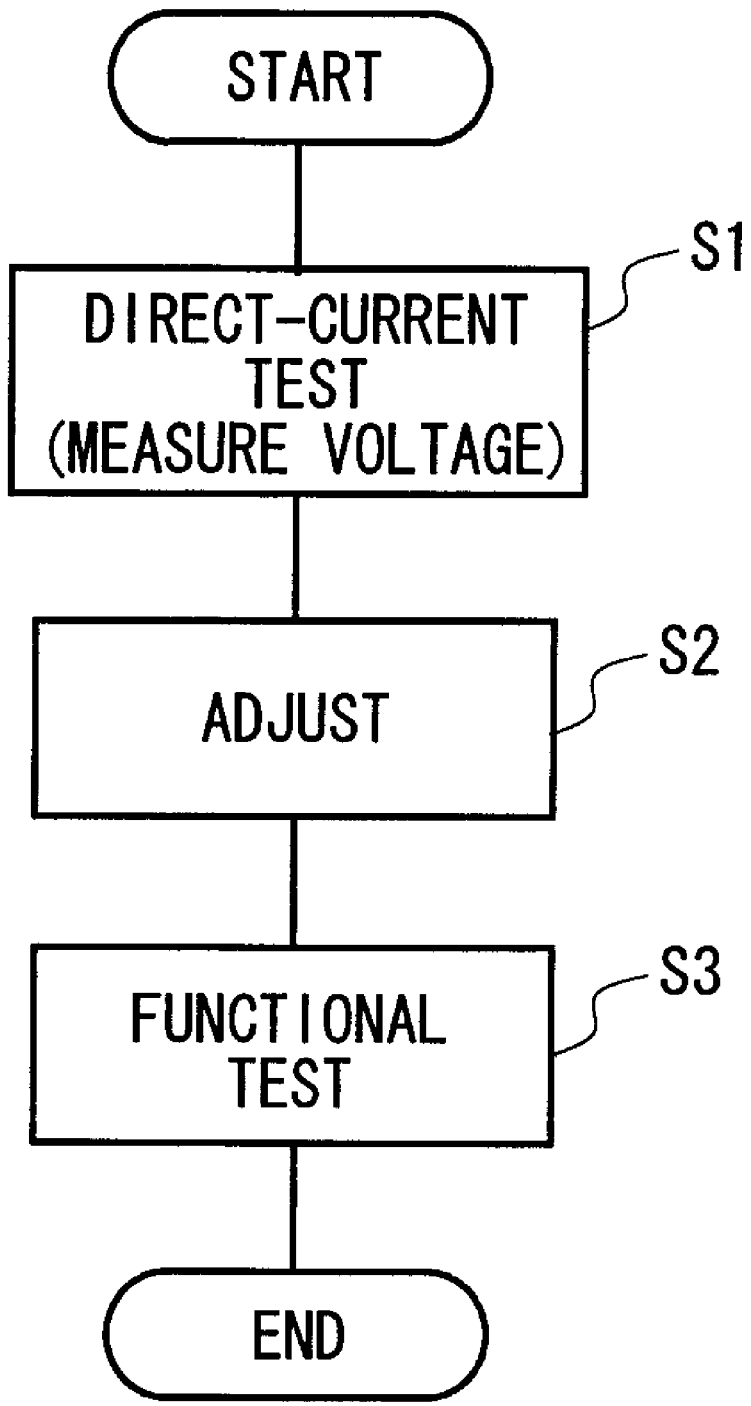
FIG. 3 illustrates an exemplary flow of test operations by the test apparatus 10 relating to the embodiment of the present invention.

FIG. 3 illustrates an exemplary flow of test operations by the test apparatus 10 relating to the present embodiment. To begin with, the test apparatus 10 tests the DUT 200 in terms of the direct-current characteristics (S1). For example, the test apparatus 10 may measure the quantity of the current when a predetermined direct-current voltage is applied to the signal I/O terminal 220 of the DUT 200 or measure the voltage of the signal I/O terminal 220 of the DUT 200 when a predetermined direct-current current is supplied.

During the direct-current test, the voltage measuring section 52 measures the voltage of the I/O pin 20 that is observed when the output voltage has been output and the response signal has not been output. In one example, the voltage measuring section 52 measures the voltage of the I/O pin 20 that is observed when the main driving section 32 outputs the H-logic output voltage $V_{IH}$ and the L-logic output voltage $V_{IL}$. When the resistance value of the output resistance 34 is known, the voltage measuring section 52 may measure the resistance value between the I/O pin 20 and the ground and obtain the no-response I/O pin voltage Vb based on the measured resistance value.

After S1, the adjusting section 56 adjusts the voltage dividing ratios of the first and second resistance voltage dividing sections 40 and 48 based on the no-response I/O pin voltage Vb, which is measured during the direct-current test (S2). Subsequently, the test apparatus 10 performs a functional test to test the functionality of the DUT 200 by varying the logic level of the test signal (S3).

As stated above, the adjusting section 56 adjusts the voltage dividing ratios of the first and second resistance voltage dividing sections 40 and 48 so that the divided voltages become equal to the voltage measured by the voltage measuring section 52, prior to the functional test on the DUT 200. As a result, the test apparatus 10 can efficiently adjust the voltage dividing ratios of the first and second resistance voltage dividing sections 40 and 48.

Figure 4:
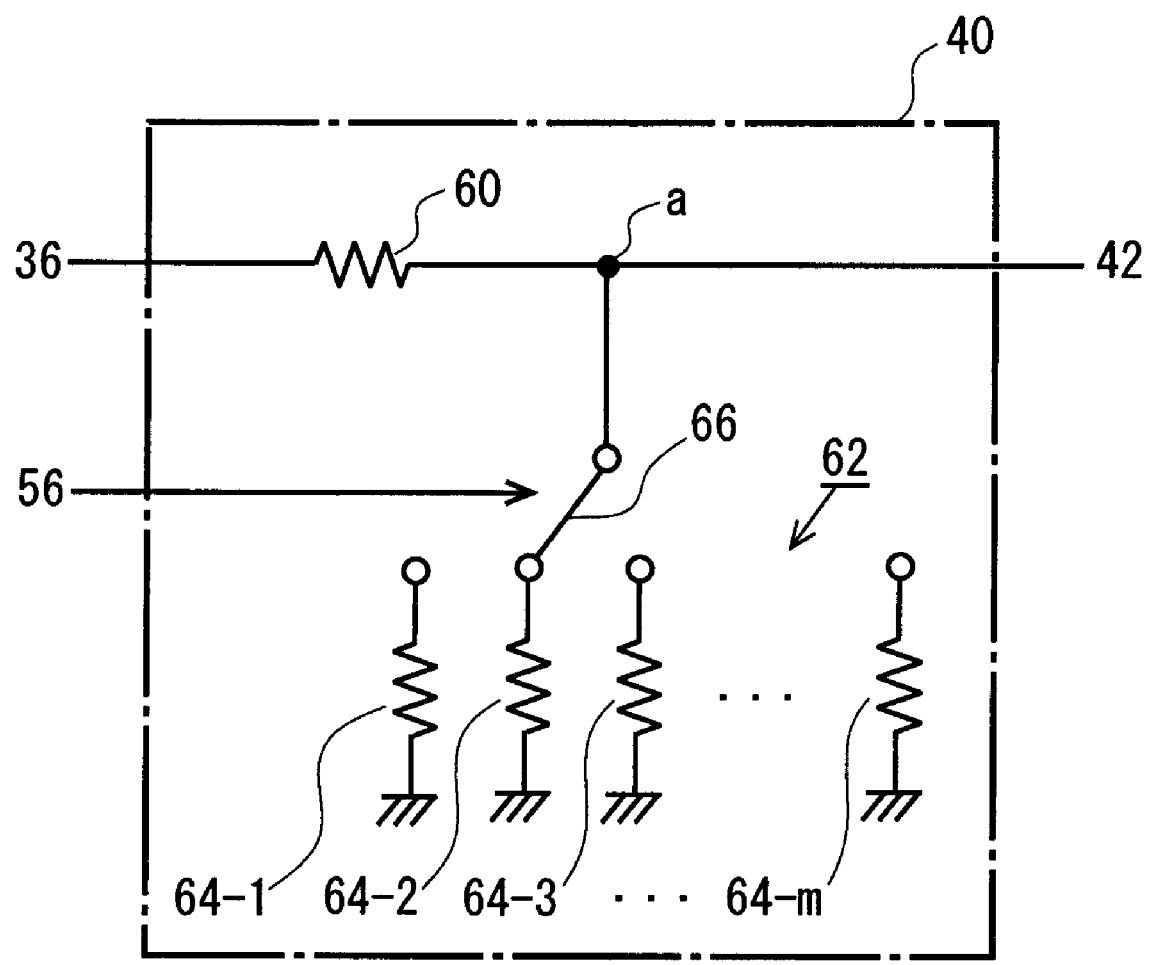
FIG. 4 illustrates an exemplary configuration of a second resistance 62 relating to the embodiment of the present invention.

FIG. 4 illustrates an exemplary configuration of the second resistance 62 relating to the present embodiment. For example, the second resistance 62 may include a plurality of resistances 64 (64-1, 64-2, ..., 64-m) having different resistance values and a switch 66. Each of the resistances 64 is connected to the ground at its one end.

The switch 66 connects one of the resistances 64 at its end that is not connected to the ground, to the connection point a, under the control of the adjusting section 56. In this manner, the switch 66 can vary the resistance value under the control of the adjusting section 56.

Figure 5:
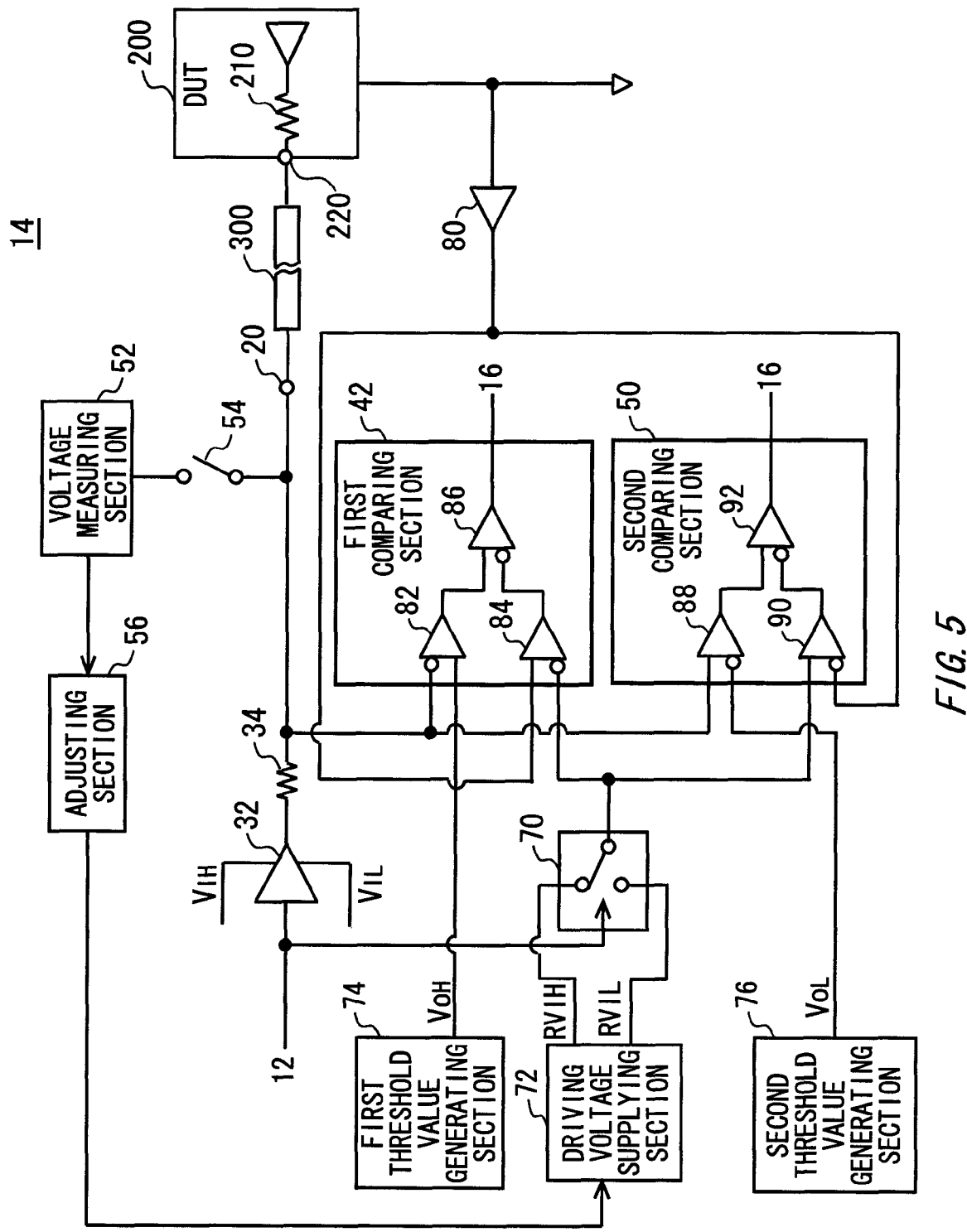
FIG. 5 illustrates the configuration of the signal I/O section 14 relating to a first modification example of the embodiment.

FIG. 5 illustrates the configuration of the signal I/O section 14 relating to a first modification example of the present embodiment, together with the DUT 200 and the transmission line 300. Since the test apparatus 10 relating to the first modification example has substantially the same configurations and functions as the test apparatus 10 shown in FIGS. 1 and 2, the constituents having substantially the same configurations and functions are assigned the same reference numerals and are not explained. The following only describes the differences between the first modification example and the embodiment shown in FIGS. 1 and 2.

According to the first modification example, the signal I/O section 14 includes a replica driving section 70, a driving voltage supplying section 72, a first threshold value generating section 74, and a second threshold value generating section 76, in place of the first replica driving section 36, the first resistance voltage dividing section 40, the second replica driving section 44 and the second resistance voltage dividing section 48.

The replica driving section 70 outputs a comparison voltage determined in accordance with the test signal. According to the first modification example, the replica driving section 70 outputs an H-logic comparison voltage $R_{VIH}$ corresponding to the H logic when the test signal indicates the H logic, and outputs an L-logic comparison voltage $R_{VIL}$ corresponding to the L logic when the test signal indicates the L logic.

The output voltage level of the replica driving section 70 is adjustable from outside. In one example, the replica driving section 70 is configured so that the H-logic comparison voltage $R_{VIH}$ and the L-logic comparison voltage $R_{VIL}$ are adjustable from outside. According to the first modification example, the output voltage level of the replica driving section 70 is adjusted in accordance with the increase or decrease in the driving voltage used to drive the replica driving section 70.

For example, the replica driving section 70 may be a selector that switches the output between the H-logic comparison voltage $R_{VIH}$ and the L-logic comparison voltage $R_{VIL}$. In this case, the replica driving section 70 selects and outputs the H-logic comparison voltage $R_{VIH}$ when the test signal indicates the H logic, and selects and outputs the L-logic comparison voltage $R_{VIL}$ when the test signal indicates the L logic. As another example, the replica driving section 70 may be a driver circuit that has the same functionality as the main driving section 32. In this case, the replica driving section 70 can output a comparison voltage accurately synchronized with the output voltage of the main driving section 32.

The driving voltage supplying section 72 supplies the driving voltage to the replica driving section 70. The driving voltage supplying section 72 increases or decreases the driving voltage for the replica driving section 70 under the control of the adjusting section 56. In this manner, the driving voltage supplying section 72 can adjust the level of the output voltage from the replica driving section 70, under the control of the adjusting section 56.

The first threshold value generating section 74 generates a predetermined H-logic threshold voltage $V_{OH}$. The second threshold value generating section 76 generates a predetermined L-logic threshold voltage $V_{OL}$.

The first comparing section 42 compares the voltage of the I/O pin 20 with the voltage obtained by adding together the predetermined H-logic threshold voltage $V_{OH}$ and the comparison voltage. The first comparing section 42 outputs a comparison result representing whether or not the response signal output from the DUT 200 indicates the H logic.

For example, the first comparing section 42 may include a first differential amplifier 82, a second differential amplifier 84, and a third differential amplifier 86. The first differential amplifier 82 outputs a voltage obtained by subtracting the voltage of the I/O pin 20 from the H-logic threshold voltage $V_{OH}$. The second differential amplifier 84 outputs a voltage obtained by subtracting the comparison voltage from the ground potential of the DUT 200 which may be supplied, for example, via a buffer 80. The third differential amplifier 86 outputs a voltage obtained by subtracting the output voltage of the second differential amplifier 84 from the output voltage of the first differential amplifier 82. With such a configuration, the first comparing section 42 can compare the level of the response signal output from the DUT 200 with the H-logic threshold voltage $V_{OH}$, and output a comparison result representing whether or not the response signal indicates the H logic.

The second comparing section 50 compares the voltage of the I/O pin 20 with the voltage obtained by adding together the predetermined L-logic threshold voltage $V_{OL}$ and the comparison voltage. The second comparing section 50 outputs a comparison result representing whether or not the response signal output from the DUT 200 indicates the L logic.

For example, the second comparing section 50 may include a fourth differential amplifier 88, a fifth differential amplifier 90, and a sixth differential amplifier 92. The fourth differential amplifier 88 outputs a voltage obtained by subtracting the L-logic threshold voltage $V_{OL}$ from the voltage of the I/O pin 20. The fifth differential amplifier 90 outputs a voltage obtained by subtracting the ground potential of the DUT 200 which may be supplied, for example, via the buffer 80, from the comparison voltage. The sixth differential amplifier 92 outputs a voltage obtained by subtracting the output voltage of the fifth differential amplifier 90 from the output voltage of the fourth differential amplifier 88. With such a configuration, the second comparing section 50 can compare the level of the response signal output from the DUT 200 with the L-logic threshold voltage $V_{OL}$, and output a comparison result representing whether or not the response signal indicates the L logic.

The voltage measuring section 52 measures the voltage of the I/O pin 20 that is observed when the main driving section 32 has output the output voltage and the signal I/O terminal 220 of the DUT 200 has not output the response signal (the no-response I/O pin voltage Vb). For example, the voltage measuring section 52 may measure the no-response I/O pin voltage Vb in the following manner.

To start with, the voltage measuring section 52 sets the DUT 200 to the termination mode, so that the signal I/O terminal 220 of the DUT 200 is terminated. Following this, while the DUT 200 is in the termination mode, the voltage measuring section 52 measures the voltage $V_{VH}$ of the I/O pin 20 when the main driving section 32 outputs the H-logic output voltage $V_{IH}$ and the voltage $V_{VL}$ of the I/O pin 20 when the main driving section 32 outputs the L-logic output voltage $V_{IL}$. Furthermore, while the DUT 200 is in the termination mode, the voltage measuring section 52 measures the voltage $V_{VT}$ of the I/O pin 20 when the main driving section 32 is terminated. The voltage measuring section 52 then subtracts the voltage $V_{VT}$ from the voltage $V_{VH}$, in order to calculate the voltage of the I/O pin 20 that is observed when the main driving section 32 has output the H-logic output voltage $V_{IH}$ and the signal I/O terminal 220 of the DUT 200 has not output the response signal. Also, the voltage measuring section 52 subtracts the voltage $V_{VT}$ from the voltage $V_{VL}$, in order to calculate the voltage of the I/O pin 20 that is observed when the main driving section 32 has output the L-logic output voltage $V_{IL}$ and the signal I/O terminal 220 of the DUT 200 has not output the response signal.

The adjusting section 56 controls the driving voltage supplying section 72 in accordance with the result of the measurement by the voltage measuring section 52 so that the comparison voltage output from the replica driving section 70 becomes equal to the no-response I/O pin voltage Vb. In one example, the adjusting section 56 controls the driving voltage supplying section 72 so that the H-logic comparison voltage $R_{VIH}$ output from the replica driving section 70 when the test signal indicates the H logic becomes equal to the voltage obtained by subtracting the voltage $V_{VT}$ from the voltage $V_{VH}$, which is measured by the voltage measuring section 52. As another example, the adjusting section 56 controls the driving voltage supplying section 72 so that the L-logic comparison voltage $R_{VIL}$ output from the replica driving section 70 when the test signal indicates the L logic becomes equal to the voltage obtained by subtracting the voltage $V_{VT}$ from the voltage $V_{VL}$, which is measured by the voltage measuring section 52.

For example, the adjusting section 56 may directly detect the output voltage of the replica driving section 70 and adjust the driving voltage supplied to the replica driving section 70 so that the comparison voltage takes an appropriate value. Alternatively, the adjusting section 56 may detect only one of the H-logic output voltage $V_{IH}$ and the L-logic comparison voltage $R_{VIL}$, and adjust both of the H-logic comparison voltage $R_{VIH}$ and the L-logic comparison voltage $R_{VIL}$ in accordance with the result of detecting one of the voltages.

The above-described test apparatus 10 relating to the first modification example compares the voltage of the I/O pin 20 with the voltage obtained by adding together the comparison voltage output from the replica driving section 70 and the threshold voltage. Therefore, the test apparatus 10 relating to the first modification example can achieve the same effects as the test apparatus 10 shown in FIG. 1. In addition, the test apparatus 10 relating to the first modification example has the single replica driving section 70 for more than one comparing section (the first and second comparing sections 42 and 50), thereby reducing the power consumption.

Figure 6:
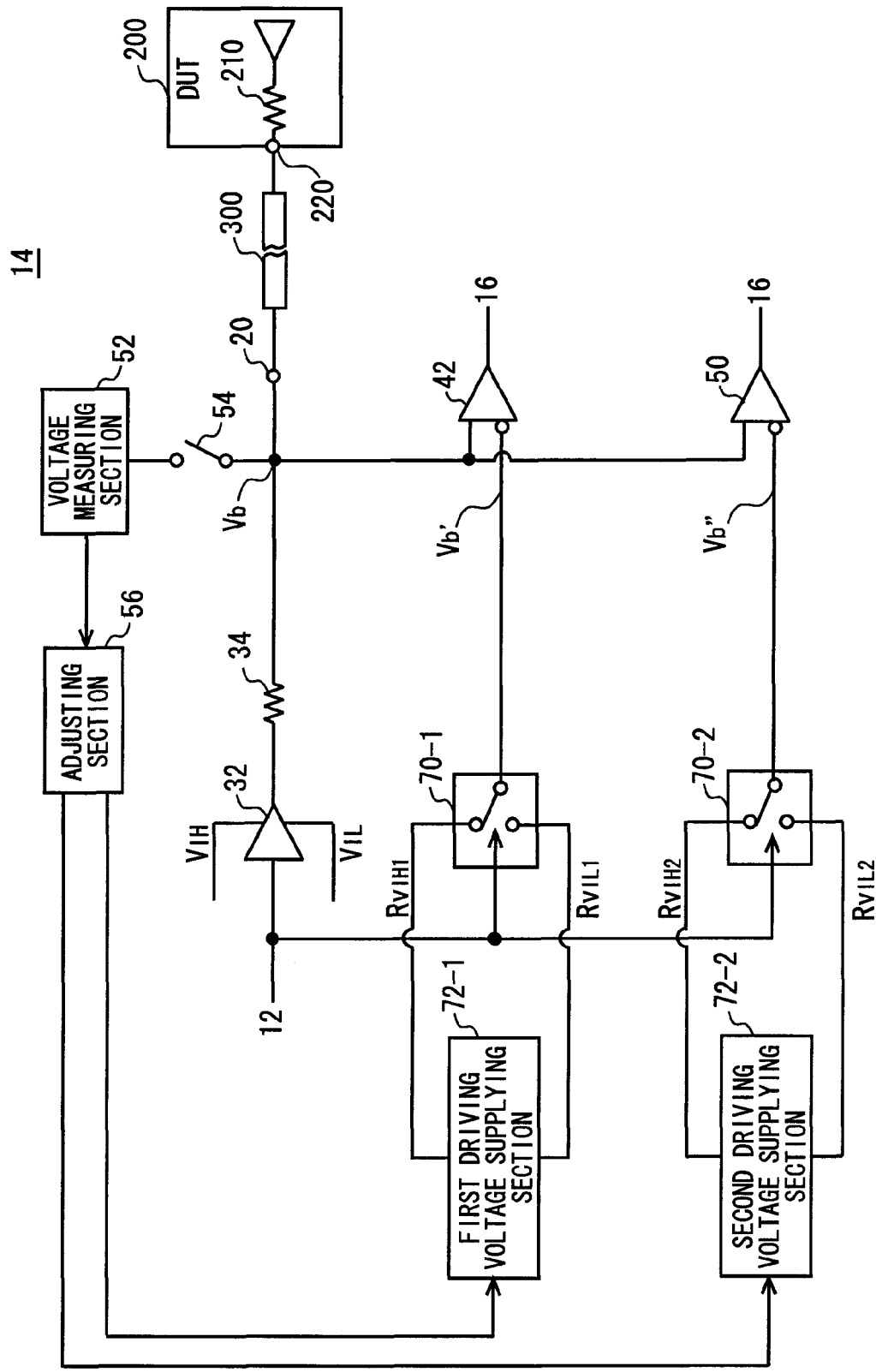
FIG. 6 illustrates the configuration of the signal I/O section 14 relating to a second modification example of the embodiment.

FIG. 6 illustrates the configuration of the signal I/O section 14 relating to a second modification example of the present embodiment, together with the DUT 200 and the transmission line 300. Since the test apparatus 10 relating to the second modification example has substantially the same configurations and functions as the test apparatus 10 relating to the first modification example, the constituents having substantially the same configurations and functions are assigned the same reference numerals and are not explained. The following only describes the differences between the first and second modification examples.

The signal I/O section 14 relating to the second modification example includes a first replica driving section 70-1, a second replica driving section 70-2, a first driving voltage supplying section 72-1, and a second driving voltage supplying section 72-2, in place of the replica driving section 70, the first threshold value generating section 74, and the second threshold value generating section 76.

The first replica driving section 70-1 outputs the H-logic comparison voltage $R_{VIH1}$ corresponding to the H logic when the test signal indicates the H logic, and outputs the L-logic comparison voltage $R_{VIL1}$ corresponding to the L logic when the test signal indicates the L logic.

The first driving voltage supplying section 72-1 supplies a driving voltage to the first replica driving section 70-1 under the control of the adjusting section 56. The first driving voltage supplying section 72-1 increases or decreases the driving voltage for the first replica driving section 70-1. In this manner, the first driving voltage supplying section 72-1 can adjust the level of the output voltage of the first replica driving section 70-1 under the control of the adjusting section 56.

The second replica driving section 70-2 outputs the H-logic comparison voltage $R_{VIH2}$ corresponding to the H logic when the test signal indicates the H logic, and outputs the L-logic comparison voltage $R_{VIL2}$ corresponding to the L logic when the test signal indicates the L logic.

The second driving voltage supplying section 72-2 supplies a driving voltage to the second replica driving section 70-2 under the control of the adjusting section 56. The second driving voltage supplying section 72-2 increases or decreases the driving voltage of the second replica driving section 70-2. In this manner, the second driving voltage supplying section 72-2 can adjust the level of the output voltage of the second replica driving section 70-2 under the control of the adjusting section 56.

The adjusting section 56 adjusts the comparison voltages output from the first and second replica driving sections 70-1 and 70-2 based on the result of the measurement by the voltage measuring section 52. More specifically, the adjusting section 56 adjusts the comparison voltage output from the first replica driving section 70-1 so as to be equal to the voltage obtained by adding together the no-response I/O pin voltage Vb and the H-logic threshold voltage $V_{OH}$. In this manner, when the test signal indicates the H logic, the first replica driving section 70-1 can output, to the first comparing section 42, the comparison voltage $R_{VIH1}$, which is obtained by adding together the H-logic threshold voltage $V_{OH}$ and the voltage of the I/O pin 20 that is observed when the main driving section 32 has output the H-logic output voltage $V_{IH}$ and the signal I/O terminal 220 of the DUT 200 has not output the response signal. Also, when the test signal indicates the L logic, the first replica driving section 70-1 can output, to the first comparing section 42, the comparison voltage $R_{VIL1}$, which is obtained by adding together the H-logic threshold voltage $V_{OH}$ and the voltage of the I/O pin 20 that is observed when the main driving section 32 has output the L-logic output voltage $V_{IL}$ and the signal I/O terminal 220 of the DUT 200 has not output the response signal.

Furthermore, the adjusting section 56 adjusts the comparison voltage output from the second replica driving section 70-2 so as to be equal to the voltage obtained by adding together the no-response I/O pin voltage Vb and the L-logic threshold voltage $V_{OL}$. In this manner, when the test signal indicates the H logic, the second replica driving section 70-2 can output, to the second comparing section 50, the comparison voltage $R_{VIL2}$, which is obtained by adding together the L-logic threshold voltage $V_{OL}$ and the voltage of the I/O pin 20 that is observed when the main driving section 32 has output the H-logic output voltage $V_{IH}$ and the signal I/O terminal 220 of the DUT 200 has not output the response signal. Also, when the test signal indicates the L logic, the second replica driving section 70-2 can output, to the second comparing section 50, the comparison voltage $R_{VIL2}$, which is obtained by adding together the L-logic threshold voltage $V_{OL}$ and the voltage of the I/O pin 20 that is observed when the main driving section 32 has output the L-logic output voltage $V_{IL}$ and the signal I/O terminal 220 of the DUT 200 has not output the response signal.

The above-described signal I/O section 14 relating to the second modification example does not require the first and second threshold value generating sections 74 and 76, and the first and second comparing sections 42 and 50 can be realized by using simple comparators. As a result, the second modification example can simplify the configuration of the signal I/O section 14.

Figure 7:
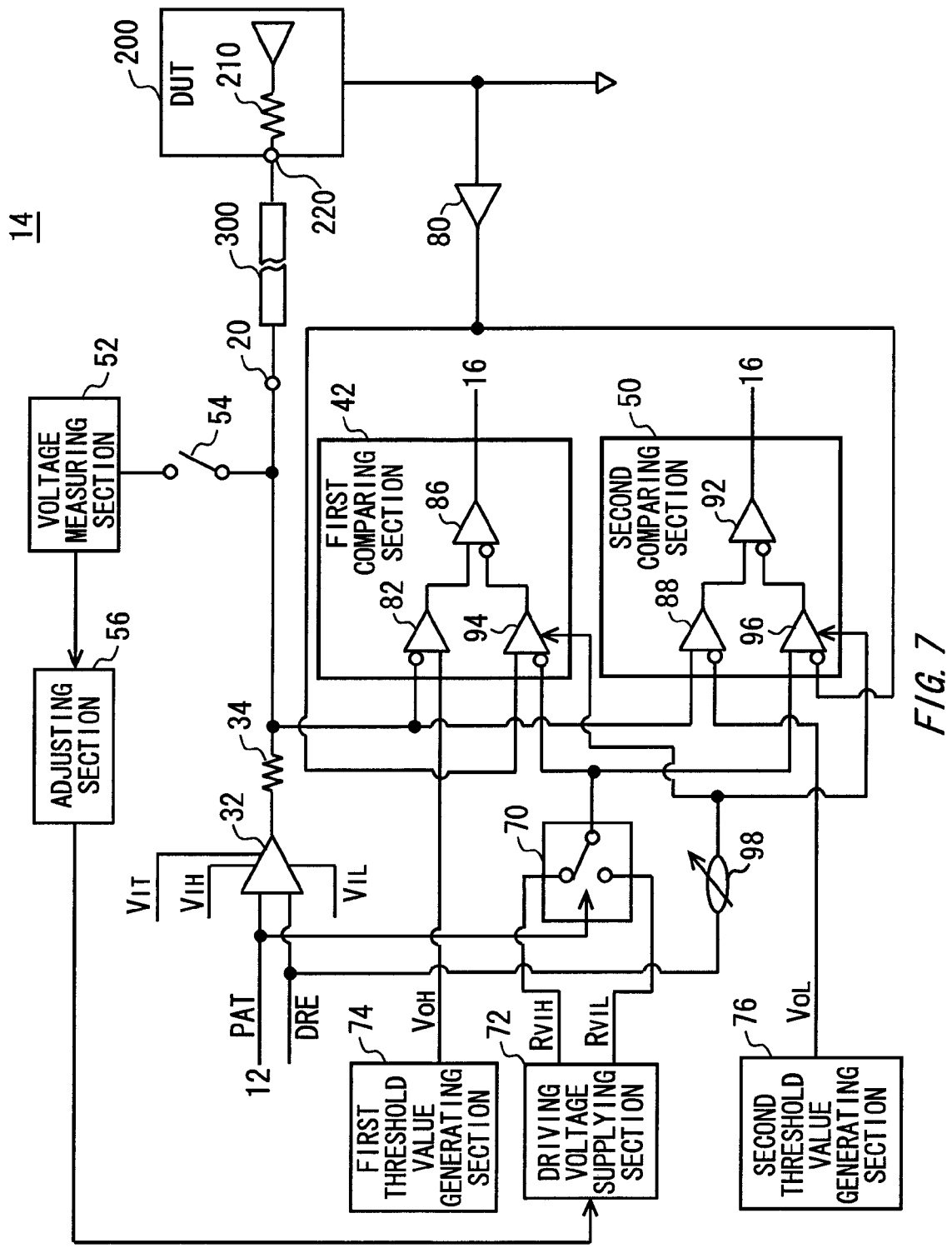
FIG. 7 illustrates the configuration of the signal I/O section 14 relating to a third modification example of the embodiment.

FIG. 7 illustrates the configuration of the signal I/O section 14 relating to a third modification example of the present embodiment, together with the DUT 200 and the transmission line 300. Since the signal I/O section 14 relating to the third modification example has substantially the same configurations and functions as the signal I/O section 14 relating to the first modification example shown in FIG. 5, the constituents having substantially the same configurations and functions are assigned the same reference numerals and are not explained. The following only describes the differences between the first and third modification examples.

According to the third modification example, the signal I/O section 14 receives a test signal that indicates a value indicating termination in addition to the H logic and the L logic. The signal I/O section 14 receives, as the test signal, a PAT signal and a DRE signal, for example. The PAT signal determines whether the test signal indicates the H or L logic. When the DRE signal indicates the H logic, the voltage corresponding to the PAT signal is to be output. When the DRE signal indicates the L logic, the test signal indicates the termination value.

The main driving section 32 is a three-valued driver. Specifically speaking, the main driving section 32 outputs the H-logic output voltage $V_{IH}$ when the test signal indicates the H logic, outputs the L-logic output voltage $V_{IL}$ when the test signal indicates the L logic, and outputs the termination voltage $V_{IT}$ when the test signal indicates the termination value. The termination voltage $V_{IT}$ terminates the transmission line 300, and may be defined as an intermediate value between the H-logic output voltage $V_{IH}$ and the L-logic output voltages $V_{IL}$, for example.

In one example, the main driving section 32 outputs the H-logic output voltage $V_{IH}$ when the DRE signal indicates the H logic and the PAT signal indicates the H logic, and outputs the L-logic output voltage $V_{IL}$ when the DRE signal indicates the H logic and the PAT signal indicates the L logic. Furthermore, the main driving section 32 outputs the termination voltage $V_{IT}$ irrespective of the logic level of the PAT signal when the DRE signal indicates the L logic.

In one example, the replica driving section 70 outputs the comparison voltage determined in accordance with the PAT signal. The replica driving section 70 outputs the H-logic comparison voltage $R_{VIH}$ corresponding to the H logic when the PAT signal indicates the H logic, and outputs the L-logic comparison voltage $R_{VIL}$ corresponding to the L logic when the PAT signal indicates the L logic.

The first comparing section 42 compares the voltage of the I/O pin 20 with the voltage obtained by adding together the predetermined H-logic threshold voltage $V_{OH}$ and the comparison voltage, when the test signal indicates a value other than the termination value. Furthermore, the first comparing section 42 compares the voltage of the I/O pin 20 with the H-logic threshold voltage $V_{OH}$ when the test signal indicates the termination value. With such a configuration, the first comparing section 42 compares the voltage of the I/O pin 20 with the H-logic threshold voltage $V_{OH}$ when the main driving section 32 outputs the termination voltage $V_{IT}$, thereby outputting an accurate comparison result.

For example, the first comparing section 42 may include a seventh differential amplifier 94 in place of the second differential amplifier 84. The seventh differential amplifier 94 outputs a voltage obtained by subtracting the comparison voltage from the ground potential of the DUT 200, when the DRE signal indicates the H logic (i.e., when the main driving section 32 outputs one of the H-logic output voltage $V_{IH}$ and the L-logic output voltage $V_{IL}$). The seventh differential amplifier 94 outputs a ground voltage (the voltage value is 0), when the DRE signal indicates the L logic (i.e., when the main driving section 32 outputs the termination voltage $V_{IT}$). The third differential amplifier 86 outputs a voltage obtained by subtracting the output voltage of the seventh differential amplifier 94 from the output voltage of the first differential amplifier 82. With the above configuration, the first comparing section 42 can compare the voltage of the I/O pin 20 with the H-logic threshold voltage ($V_{OH}$) irrespective of the logic level of the PAT signal, when the main driving section 32 outputs the termination voltage $V_{IT}$.

The second comparing section 50 compares the voltage of the I/O pin 20 with the voltage obtained by adding together the predetermined L-logic threshold voltage $V_{OL}$ and the comparison voltage, when the test signal indicates a value other than the termination value. Furthermore, the second comparing section 50 compares the voltage of the I/O pin 20 with the L-logic threshold voltage $V_{OL}$ when the test signal indicates the termination value. With such a configuration, the second comparing section 50 compares the voltage of the I/O pin 20 with the L-logic threshold voltage $V_{OL}$ when the main driving section 32 outputs the termination voltage $V_{IT}$, thereby outputting an accurate comparison result.

For example, the second comparing section 50 may include an eighth differential amplifier 96 in place of the fifth differential amplifier 90. The eighth differential amplifier 96 outputs a voltage obtained by subtracting the ground potential of the DUT 200 from the comparison voltage, when the DRE signal indicates the H logic (i.e., when the main driving section 32 outputs one of the L-logic output voltage $V_{IH}$ and the H-logic output voltage $V_{IL}$. The eighth differential amplifier 96 outputs a ground voltage (the voltage value is 0), when the DRE signal indicates the L logic (i.e., when the main driving section 32 outputs the termination voltage $V_{IT}$). The sixth differential amplifier 92 outputs a voltage obtained by subtracting the output voltage of the eighth differential amplifier 96 from the output voltage of the fourth differential amplifier 88. With the above configuration, the second comparing section 50 can compare the voltage of the I/O pin 20 with the L-logic threshold voltage ($V_{OL}$) irrespective of the logic level of the PAT signal, when the main driving section 32 outputs the termination voltage $V_{IT}$.

The above-described test apparatus 10 relating to the third modification example compares the voltage of the I/O pin 20 with the threshold voltage when the main driving section 32 outputs the termination voltage $V_{IT}$. As a result, even when the main driving section 32 is a three-valued driver, the test apparatus 10 relating to the third modification example can achieve the same effects as the test apparatus 10 shown in FIG. 1.

Referring to the third modification example, the signal I/O section 14 may further include a delay element 98. The delay element 98 delays the DRE signal and supplies the delayed DRE signal to the seventh and eighth differential amplifiers 94 and 96. For example, the delay element 98 may delay the DRE signal by a time determined in accordance with the response delay of the termination voltage $V_{IT}$ of the main driving section 32. The delay element 98 can cause the main driving section 32 to generate the termination voltage $V_{IT}$ and stop the generation concurrently with when the seventh differential amplifier 94 generates the ground voltage and stops the generation.

Figure 8:
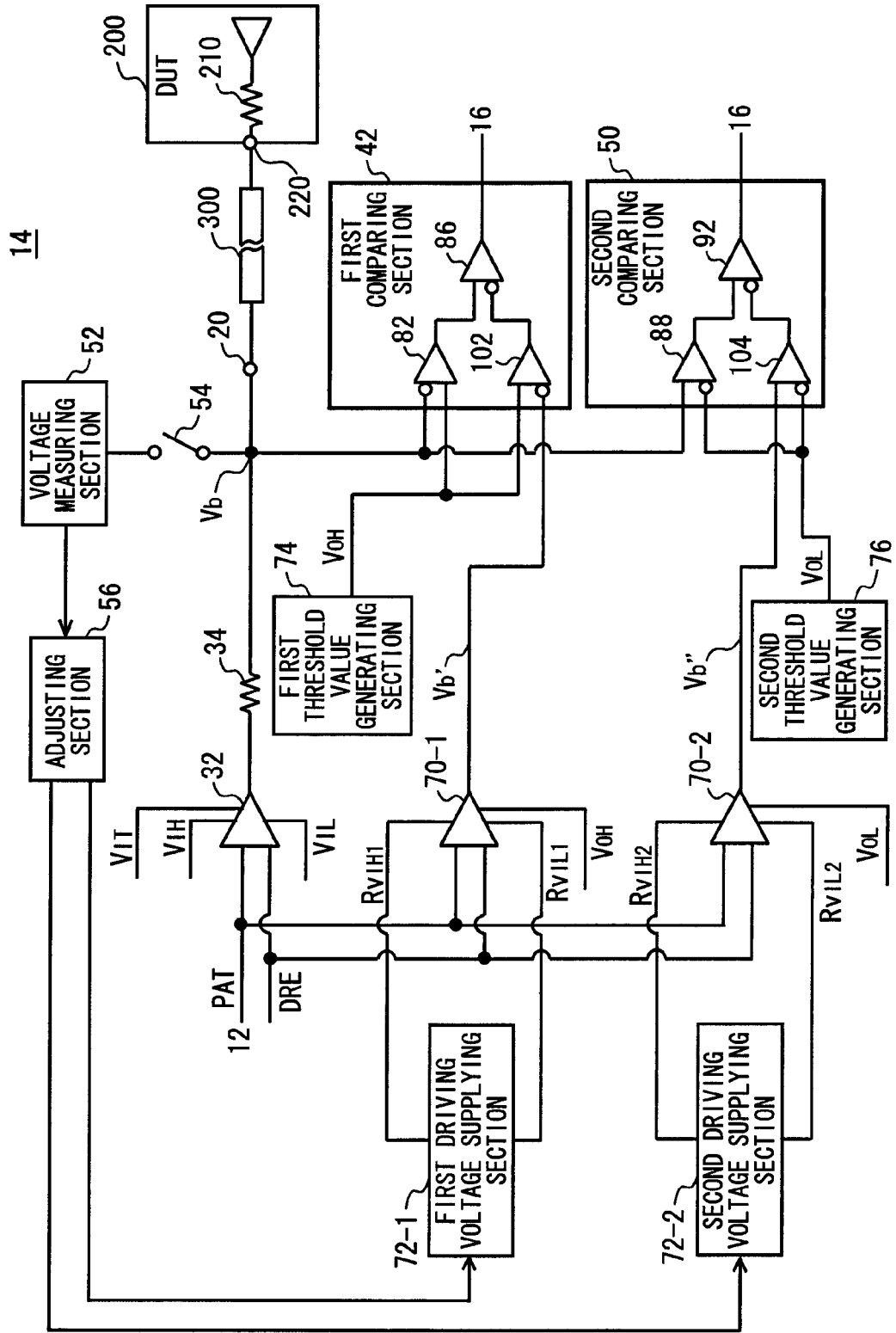
FIG. 8 illustrates the configuration of the signal I/O section 14 relating to a fourth modification example of the embodiment.

FIG. 8 illustrates the configuration of the signal I/O section 14 relating to a fourth modification example of the present embodiment, together with the DUT 200 and the transmission line 300. Since the signal I/O section 14 relating to the fourth modification example has substantially the same configurations and functions as the signal I/O section 14 relating to the third modification example shown in FIG. 7, the constituents having substantially the same configurations and functions are assigned the same reference numerals and are not explained. The following only describes the differences between the third and fourth modification examples.

According to the fourth modification example, the signal I/O section 14 includes a first replica driving section 70-1, a second replica driving section 70-2, a first driving voltage supplying section 72-1, and a second driving voltage supplying section 72-2, in place of the replica driving section 70.

The first replica driving section 70-1 is a three-valued driver. The first replica driving section 70-1 outputs the H-logic comparison voltage $R_{VIH1}$ corresponding to the H logic when the test signal indicates the H logic, and outputs the L-logic comparison voltage $R_{VIL1}$ corresponding to the L logic when the test signal indicates the L logic. The first replica driving section 70-1 outputs the H-logic threshold voltage $V_{OH}$ when the test signal indicates the termination value.

In one example, the first replica driving section 70-1 outputs the H-logic comparison voltage $R_{VIL1}$ when the DRE signal indicates the H logic and the PAT signal indicates the H logic, and outputs the L-logic comparison voltage $R_{VIL1}$ when the DRE signal indicates the H logic and the PAT signal indicates the L logic. Furthermore, the first replica driving section 70-1 outputs the H-logic threshold voltage $V_{OH}$ irrespective of the logic level of the PAT signal when the DRE signal indicates the L logic. For example, the first replica driving section 70-1 may be a selector that switches its output between the H-logic comparison voltage $R_{VIH1}$, the L-logic comparison voltage $R_{VIL1}$ and the H-logic threshold voltage $V_{OH}$.

The second replica driving section 70-2 is a three-valued driver. The second replica driving section 70-2 outputs the H-logic comparison voltage $R_{VIH2}$ corresponding to the H logic when the test signal indicates the H logic, and outputs the L-logic comparison voltage $R_{VIL2}$ corresponding to the L logic when the test signal indicates the L logic. The second replica driving section 70-2 outputs the L-logic threshold voltage $V_{OL}$ when the test signal indicates the termination value.

In one example, the second replica driving section 70-2 outputs the H-logic comparison voltage $R_{VIH2}$ when the DRE signal indicates the H logic and the PAT signal indicates the H logic, and outputs the L-logic comparison voltage $R_{VIL2}$ when the DRE signal indicates the H logic and the PAT signal indicates the L logic. Furthermore, the second replica driving section 70-2 outputs the L-logic threshold voltage $V_{OL}$ irrespective of the logic level of the PAT signal when the DRE signal indicates the L logic. For example, the second replica driving section 70-2 may be a selector that switches its output between the H-logic comparison voltage $R_{VIL1}$, the L-logic comparison voltage $R_{VIL1}$ and the L-logic threshold voltage $V_{OL}$.

The first driving voltage supplying section 72-1 is the same as the first driving voltage supplying section 72-1 relating to the second modification example shown in FIG. 6, and therefore not explained here in detail. The second driving voltage supplying section 72-2 is the same as the second driving voltage supplying section 72-2 relating to the second modification example shown in FIG. 6, and therefore not explained here in detail.

The first comparing section 42 may include a ninth differential amplifier 102 in place of the seventh differential amplifier 94. The ninth differential amplifier 102 outputs a voltage obtained by subtracting the comparison voltage output from the first replica driving section 70-1, from the H-logic threshold voltage $V_{OH}$. The third differential amplifier 86 outputs a voltage obtained by subtracting the output voltage of the ninth differential amplifier 102 from the output voltage of the first differential amplifier 82. With the above configuration, the first comparing section 42 can compare the voltage of the I/O pin 20 with the H-logic threshold voltage $V_{OH}$ irrespective of the logic level of the PAT signal, when the main driving section 32 outputs the termination voltage $V_{IT}$.

The second comparing section 50 may include a tenth differential amplifier 104 in place of the eighth differential amplifier 96. The tenth differential amplifier 104 outputs a voltage obtained by subtracting the L-logic threshold voltage $V_{OL}$ from the comparison voltage output from the second replica driving section 70-2. The sixth differential amplifier 92 outputs a voltage obtained by subtracting the output voltage of the tenth differential amplifier 104 from the output voltage of the fourth differential amplifier 88. With the above configuration, the second comparing section 50 can compare the voltage of the I/O pin 20 with the L-logic threshold voltage $V_{OL}$ irrespective of the logic level of the PAT signal, when the main driving section 32 outputs the termination voltage $V_{IT}$.

The adjusting section 56 adjusts the comparison voltages output from the first and second replica driving sections 70-1 and 70-2 based on the result of the measurement by the voltage measuring section 52. More specifically, the adjusting section 56 adjusts the comparison voltage output from the first replica driving section 70-1 when the test signal indicates a value other than the termination value (for example, when the DRE signal indicates the H logic) so as to be equal to the voltage obtained by adding together the no-response I/O pin voltage Vb and the H-logic threshold voltage $V_{OH}$, similarly to the second modification example.

Also, the adjusting section 56 adjusts the comparison voltage output from the second replica driving section 70-2 when the test signal indicates a value other than the termination value (for example, when the DRE signal indicates the H logic), so as to be equal to the voltage obtained by adding together the no-response I/O pin voltage Vb and the L-logic threshold voltage $V_{OL}$, similarly to the second modification example.

The above-described test apparatus 10 relating to the fourth modification example compares the voltage of the I/O pin 20 with the threshold voltage when the main driving section 32 outputs the termination voltage $V_{IT}$. As a result, even when the main driving section 32 is a three-valued driver, the test apparatus 10 relating to the fourth modification example can produce the same effects as the test apparatus 10 shown in FIG. 1.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alternations or improvements can be included in the technical scope of the invention.

For example, the signal I/O section 14 relating to the present embodiment may be configured to function as a transmission apparatus that transmits/receives a signal to/from a different apparatus. In this case, the signal I/O section 14 is connected to the different apparatus, in place of the DUT 200, via the transmission line 300. The I/O pin 20 is supplied with an output voltage determined in accordance with a transmission signal generated by the main driving section 32 and a voltage determined in accordance with a reception signal output from the different apparatus.

What is claimed is:

1. A test apparatus for testing a device under test, comprising:
   a test signal generating section that generates a test signal to be supplied to the device under test;
   a main driving section that outputs an output voltage determined in accordance with the test signal, to an input/output pin connected to a signal input/output terminal of the device under test;
   a replica driving section that outputs a comparison voltage determined in accordance with the test signal;
   a resistance voltage dividing section that generates a divided voltage by resistance-dividing the comparison voltage;
   a comparing section that compares a voltage of the input/output pin with the divided voltage;
   a judging section that judges acceptability of the device under test based on a result of the comparison by the comparing section; and
   an adjusting section that adjusts a voltage dividing ratio of the resistance voltage dividing section.

2. The test apparatus as set forth in claim 1, wherein
   the adjusting section adjusts the voltage dividing ratio of the resistance voltage dividing section so that the divided voltage becomes equal to a voltage obtained by adding together a predetermined threshold voltage and a voltage of the input/output pin that is observed when the main driving section has output the output voltage and the signal input/output terminal of the device under test has not output a response signal.

3. The test apparatus as set forth in claim 2, further comprising
   a voltage measuring section that measures the voltage of the input/output pin that is observed when the main driving section has output the output voltage and the signal input/output terminal has not output the response signal, wherein
   the adjusting section adjusts the voltage dividing ratio of the resistance voltage dividing section based on a result of the measurement by the voltage measuring section.

4. The test apparatus as set forth in claim 3, wherein
   the voltage measuring section measures the voltage of the input/output pin that is observed when the main driving section has output the output voltage and the signal input/output terminal has not output the response signal, during a direct-current test for testing a direct-current characteristic of the device under test, and
   the adjusting section adjusts the voltage dividing ratio of the resistance voltage dividing section so that the divided voltage becomes equal to the voltage measured by the voltage measuring section, prior to a functional test for testing a function of the device under test by varying a logic level of the test signal.

5. A test apparatus for testing a device under test, comprising:
   a test signal generating section that generates a test signal to be supplied to the device under test;
   a main driving section that outputs an output voltage determined in accordance with the test signal, to an input/output pin connected to a signal input/output terminal of the device under test;
   a replica driving section that outputs a comparison voltage determined in accordance with the test signal;
   a comparing section that compares a voltage of the input/output pin with a voltage obtained by adding together a predetermined threshold voltage and the comparison voltage;
   a judging section that judges acceptability of the device under test based on a result of the comparison by the comparing section; and
   an adjusting section that adjusts the comparison voltage output from the replica driving section.

6. The test apparatus as set forth in claim 5, wherein
   the adjusting section adjusts the comparison voltage output from the replica driving section so as to be equal to a voltage of the input/output pin that is observed when the main driving section has output the output voltage and the signal input/output terminal of the device under test has not output a response signal.

7. The test apparatus as set forth in claim 6, wherein
   the comparing section includes:
   a first comparing section that compares the voltage of the input/output pin with a voltage obtained by adding together an H-logic threshold voltage and the comparison voltage, the H-logic threshold voltage being used to judge whether the response signal indicates an H logic; and
   a second comparing section that compares the voltage of the input/output pin with a voltage obtained by adding together an L-logic threshold voltage and the comparison voltage, the L-logic threshold voltage being used to judge whether the response signal indicates an L logic.

8. The test apparatus as set forth in claim 7, wherein
   the main driving section outputs an H-logic output voltage when the test signal indicates the H logic and outputs an L-logic output voltage when the test signal indicates the L logic,
   the replica driving section outputs an H-logic comparison voltage when the test signal indicates the H logic and outputs an L-logic comparison voltage when the test signal indicates the L logic, and
   the adjusting section adjusts the H-logic comparison voltage so as to become equal to the voltage of the input/output pin that is observed when the main driving section has output the H-logic output voltage and the signal input/output terminal has not output the response signal, and adjusts the L-logic comparison voltage so as to become equal to the voltage of the input/output pin that is observed when the main driving section has output the L-logic output voltage and the signal input/output terminal has not output the response signal.

9. The test apparatus as set forth in claim 7, wherein
   the main driving section outputs an H-logic output voltage when the test signal indicates the H logic, outputs an L-logic output voltage when the test signal indicates the L logic, and outputs a termination voltage when the test signal indicates a termination value,
   the first comparing section compares the voltage of the input/output pin with the voltage obtained by adding together the H-logic threshold voltage and the comparison voltage when the test signal indicates a value other than the termination value, and compares the voltage of the input/output pin with the H-logic threshold voltage when the test signal indicates the termination value, and the second comparing section compares the voltage of the input/output pin with the voltage obtained by adding together the L-logic threshold voltage and the comparison voltage when the test signal indicates a value other than the termination value, and compares the voltage of the input/output pin with the L-logic threshold voltage when the test signal indicates the termination value.

10. A transmission apparatus for transmitting/receiving a signal to/from a different apparatus, comprising:
- a main driving section that outputs an output voltage determined in accordance with a transmission signal, to an input/output pin connected to a signal input/output terminal of the different apparatus;
- a replica driving section that outputs a comparison voltage determined in accordance with the transmission signal;
- a resistance voltage dividing section that generates a divided voltage by resistance-dividing the comparison voltage;
- a comparing section that compares a voltage of the input/output pin with the divided voltage; and
- an adjusting section that adjusts a voltage dividing ratio of the resistance voltage dividing section.

11. The transmission apparatus as set forth in claim 10, wherein
the adjusting section adjusts the voltage dividing ratio of the resistance voltage dividing section so that the divided voltage becomes equal to a voltage obtained by adding together a predetermined threshold voltage and a voltage of the input/output pin that is observed when the main driving section has output the output voltage and the signal input/output terminal of the different apparatus has not output a reception signal.

12. A transmission apparatus for transmitting/receiving a signal to/from a different apparatus, comprising:
- a main driving section that outputs an output voltage determined in accordance with a transmission signal, to an input/output pin connected to a signal input/output terminal of the different apparatus;
- a replica driving section that outputs a comparison voltage determined in accordance with the transmission signal;
- a comparing section that compares a voltage of the input/output pin with a voltage obtained by adding together a predetermined threshold voltage and the comparison voltage; and
- an adjusting section that adjusts the comparison voltage output from the replica driving section.

13. The transmission apparatus as set forth in claim 12, wherein
the adjusting section adjusts the comparison voltage output from the replica driving section so as to be equal to a voltage of the input/output pin that is observed when the main driving section has output the output voltage and the signal input/output terminal of the different apparatus has not output a reception signal.

* * * * *